(12) United States Patent
Deng

(10) Patent No.: US 8,115,514 B2
(45) Date of Patent: Feb. 14, 2012

(54) PRE-CHARGED HIGH-SPEED LEVEL SHIFTERS

(75) Inventor: Kuo-Liang Deng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/750,441

(22) Filed: Mar. 30, 2010

(65) Prior Publication Data

US 2010/0301900 A1    Dec. 2, 2010

Related U.S. Application Data

(60) Provisional application No. 61/183,430, filed on Jun. 2, 2009.

(51) Int. Cl.
*H03K 19/094* (2006.01)
(52) U.S. Cl. .................. 326/68; 326/81; 326/83
(58) Field of Classification Search .............. 326/62–63, 326/68, 80–83, 86–87; 327/333
See application file for complete search history.

(56) References Cited

U.S. PATENT DOCUMENTS

| | | | | |
|---|---|---|---|---|
| 6,043,699 A | * | 3/2000 | Shimizu | 327/333 |
| 7,808,294 B1 | * | 10/2010 | Kottapalli | 327/333 |
| 2005/0168241 A1 | * | 8/2005 | Kim | 326/81 |

* cited by examiner

*Primary Examiner* — Shawki S Ismail
*Assistant Examiner* — Jany Tran
(74) *Attorney, Agent, or Firm* — Slater & Matsil, L.L.P.

(57) ABSTRACT

An integrated circuit structure includes a latch having a first output node and a second output node complementary to each other. A first pre-charge transistor has a source-drain path coupled between a positive power supply node and the first output node. A second pre-charge transistor has a source-drain path coupled between the positive power supply node and the second output node. The integrated circuit structure further includes a delay-inverter coupled between a signal input node and inputs of a first NMOS transistor and a second NMOS transistor in the latch. The delay-inverter is configured to allow one of the first pre-charge transistor and the second pre-charge transistor to pre-charge a respective one of the first output node and the second output node before an input signal at the signal input node arrives at a gate of a respective one of the first NMOS transistor and the second NMOS transistor.

20 Claims, 4 Drawing Sheets

PRE-CHARGED HIGH-SPEED LEVEL SHIFTERS

This application claims the benefit of U.S. Provisional Application No. 61/183,430 filed on Jun. 2, 2009, entitled "Pre-Charged High-Speed Level Shifters," which application is hereby incorporated herein by reference.

TECHNICAL FIELD

This invention relates generally to integrated circuits, and more specifically to level shifters.

BACKGROUND

Level shifters are circuits for converting an input signal having a first voltage amplitude into an output signal having a second voltage amplitude different from the first voltage amplitude. Typically, the amplitude is converted by fixing the lower potential side and converting the potential at the higher potential side. Level shifters are widely used in integrated circuits where more than one type of circuits, each having an operation voltage different from that of others, are integrated together.

A common application for level shifters is shifting the voltage of a signal transferred between an IO circuit and a core circuit in an integrated circuit device. Traditionally, the IO operation voltage was compatible with the core operation voltage. However, with the shrinking of VLSI circuits, the operation voltages of core circuits have steadily been lowered, while the IO operation voltages have stayed relatively steady, so that currently, core operation voltages are typically much lower than the IO operation voltages. For example, in deep micron technology, the core operation voltages have dropped to about 0.9V to about 1V, while the IO operation voltages are still about 1.5V to about 3.0V. Therefore, a signal needs to be level-shifted up before it is transmitted from a core circuit to an IO circuit, or level-shifted down before it is transmitted from an IO circuit to a core circuit.

FIG. 1 illustrates a conventional cross-latch level shifter circuit that converts an input signal with an amplitude of VDD, which is, e.g., a core operation voltage, to a signal with an amplitude of VDDIO, which is, e.g., an IO operation voltage that is higher than VDD. Node 102 is a power supply node at power supply voltage VDDIO. Node 104 is at VSS, typically a ground potential or at 0V. Node 106 is a signal input node and node 108 is a signal output node. The input signal voltage at node 106 switches between 0V and VDD. If the input signal voltage at node 106 is 0V, NMOS transistor 114 is turned off, so that its drain voltage at node 124 is high. Inverter 118, whose input at node 106 is low (0V), outputs a high voltage (VDD) at its output, which is connected to node 122. Because the voltage at node 122 is high, NMOS transistor 116 is turned on, thus pulling down the output voltage at node 108. Conversely, if the input signal at node 106 is VDD, NMOS transistor 114 is turned on so that its drain voltage 124 is at a low voltage. The voltage at node 122 is converted to low by inverter 118 so that NMOS transistor 116 is turned off, and the output voltage at node 108 is pulled up by PMOS transistor 112 (which forms a complementary pair with PMOS transistor 110) to VDDIO. Therefore, the input signal with the amplitude of VDD is shifted to VDDIO.

There are also other types of level shifters such as charge-pumped level shifters. However, all these conventional level shifters suffer from a common problem. Their operation speeds are typically low, and are often less than about 1 GHz, for example, conventional level shifters can only operate between 200 MHz and 800 MHz. They are thus not suitable for high-frequency operations. In addition, the conventional level shifters cannot be ported between different specifications, which means that the level shifters need to be modified for different IO operation VDDIOs such as 1.2V, 1.5V, 1.8V, 2.5V, and the like. A further problem is that the switching noise current flowing to VSS (node 104) is high. What is needed, therefore, is a novel level shifter for overcoming the above-described shortcomings in the prior art.

SUMMARY OF THE INVENTION

In accordance with one aspect of the present invention, an integrated circuit structure includes a latch having a first output node and a second output node complementary to each other. A first pre-charge transistor has a source-drain path coupled between a positive power supply node and the first output node. A second pre-charge transistor has a source-drain path coupled between the positive power supply node and the second output node. The integrated circuit structure further includes a delay-inverter coupled between a signal input node and inputs of a first NMOS transistor and a second NMOS transistor in the latch. The delay-inverter is configured to allow one of the first pre-charge transistor and the second pre-charge transistor to pre-charge the respective first output node and the second output node before an input signal at the signal input node arrives at a gate of the respective first NMOS transistor and the second NMOS transistor.

Other embodiments are also disclosed.

The advantageous features of the present invention include increased switching speed, reduced switching noise, and reduced chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Figure 4:
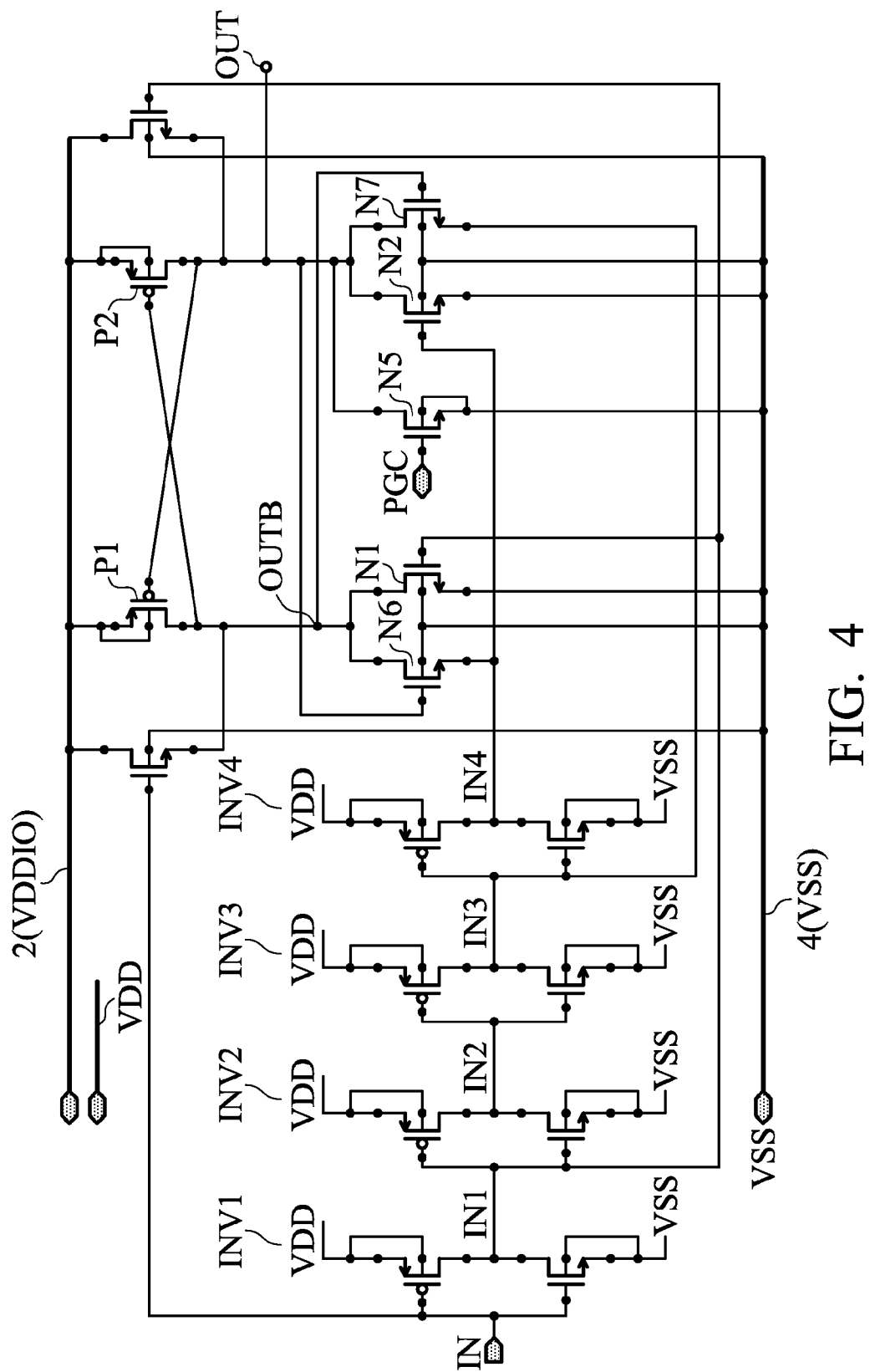
FIG. 4 illustrates a level shifter in accordance with another embodiment of the present invention, wherein the level shifter adopts the pre-charging mechanism and has a reduced switching noise.

A novel level shifter in accordance with an embodiment of the present invention is provided. The variations and the operation of the embodiment are then discussed. Throughout the various views and illustrative embodiments of the present invention, like reference numbers are used to designate like elements. Since the level shifter as shown in FIGS. 2 and 4 are substantially symmetric, the discussion regarding one side of each of the level shifters may also apply to the other side.

Figure 1:
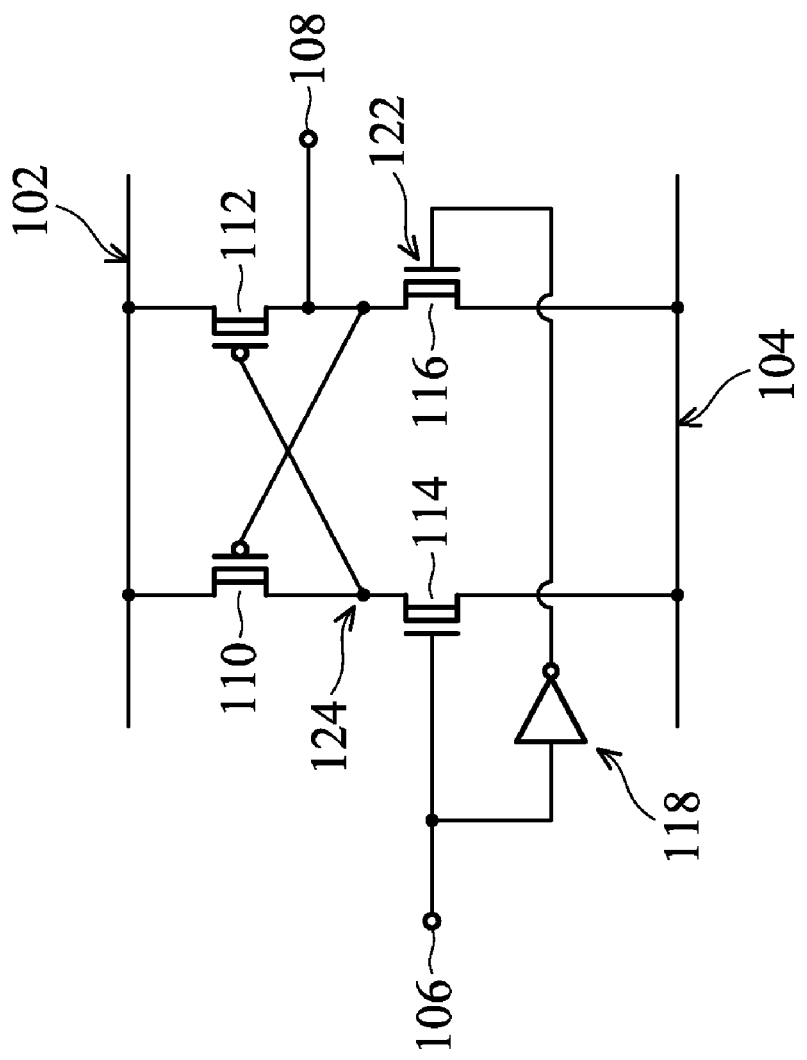
FIG. 1 illustrates a conventional level shifter.
Figure 2:
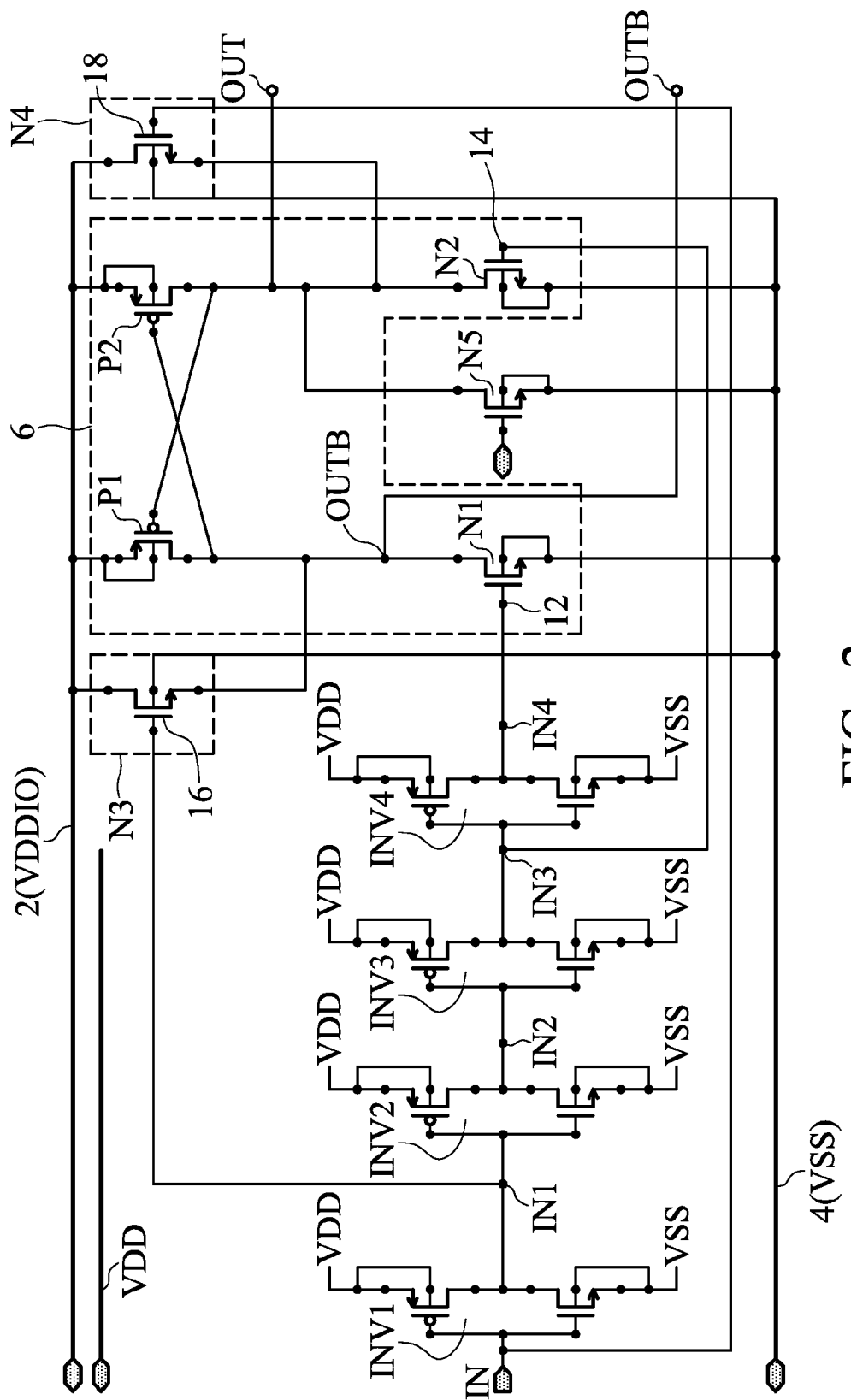
FIG. 2 illustrates a level shifter in accordance with an embodiment of the present invention, wherein the level shifter adopts a pre-charging mechanism.

FIG. 2 illustrates a circuit diagram of a level shifter in accordance with an embodiment of the present invention. Node 2 is coupled to a high positive power supply voltage denoted as VDDIO, and node 4 is coupled to a voltage VSS, which may be the ground potential or at 0V. Node IN is the signal input node. Nodes OUT and OUTB are a pair of complementary signal output nodes, and are often at inversed phases. The input signal at signal input node IN includes a pair of logical voltage levels, i.e., logical low and logical high. In the illustrated embodiments, a logical low is VSS and a logical high is VDD, which may be, for example, a positive power supply voltage of a core device. Voltage VDD is lower than voltage VDDIO. The output signal at nodes OUT and OUTB also includes a pair of logical voltage levels, logical low and logical high. In the illustrated embodiment, the logical low at the output is VSS and the logical high at the output is VDDIO, which may be the positive power supply voltage of an JO device.

PMOS transistors P1 and P2 and NMOS transistors N1 and N2 form latch 6, wherein the drains of transistors P1 and N1 are connected to output node OUTB, and the drains of transistors P2 and N2 are connected to output node OUT. The sources of PMOS transistors P1 and P2 are connected to node 2 (VDDIO), while the sources of NMOS transistors N1 and N2 are connected to node 4 (VSS). Transistor N5 is used for the power up operation of the level shifter.

Pre-charge transistor N3 has its drain connected to node 2 (VDDIO), and its source connected to output node OUTB. Throughout the description, the path between the source and the drain of a transistor is referred to as a source-drain path of the transistor. Accordingly, the source-drain path of pre-charge transistor N3 is coupled between node 2 (VDDIO) and output node OUTB. Pre-charge transistor N4 has its drain connected to node 2 (VDDIO), and its source connected to output node OUT. Pre-charge transistors N3 and N4, when turned on, are used to pre-charge output nodes OUTB and OUT, respectively, to bring up their voltage levels. Pre-charge transistors N3 and N4 may be thick transistors having their gate dielectrics thicker than that of transistors N1 and N2.

The level shifter further includes a plurality of inverters. In the illustrated exemplary embodiment, the plurality of inverters includes inverters INV1, INV2, INV3, and INV4 connected in series, that is, the output of a preceding inverter is coupled to an input of a following inverter. In alternative embodiments, the number of inverters may also be as few as two or three, or greater than four. Inverter INV4 is used to invert the input signal received by node IN, and the signal at input node IN3 of inverter INV4 is sent to gate 14 of transistor N2, while the signal at output node IN4 of inverter INV4 is sent to gate 12 of transistor N1.

Inverters INV1, INV2, and INV3 are delay-inverters, which are used to delay the arrival of the input signal at latch 6. Signal input node IN is coupled to gate 18 of pre-charge transistor N4. Therefore, when a logic high signal arrives at input node IN, the voltage at gate 18 of pre-charge transistor N4 also becomes high. Pre-charge transistor N4 is hence turned on to pre-charge output node OUT to lift up the voltage at node OUT. Throughout the description, the term "pre-charge" refers to the charging of any of output nodes OUT and OUTB by an input signal before the rising edge of the input signal arrives at any of gates 12 and 14 of transistors N1 and N2, respectively. It is noted that the rising edge of the input signal is delayed by inverters INV1, INV2, and INV3, before it reaches gate 14 of transistor N2, at which time latch 6 starts to pull up the voltage at output OUT. Accordingly, node OUT is pre-charged for a duration equal to the total delay time of inverters INV1, INV2, and INV3. On the other hand, if a falling edge of the input signal arrives at signal input node IN, the signal at node IN1 (and gate 16 of pre-charge transistor N3) will be a rising edge. Accordingly, NMOS transistor N3 pre-charges node OUTB until eventually the falling edge of the input signal passes inverters INV2, INV3, and INV4, and reaches gate 12 of transistor N1.

In the case the input signal at signal input node IN is at logic high (VDD), after the input signal arrives at NMOS transistor N1, latch 6 may maintain the logic high signal (VDDIO) at node OUT and logic low signal at node OUTB (VSS). When voltage at node OUT increases to VDDIO, pre-charge transistor N4 will be automatically turned off, and no current flows through pre-charge transistor N4 at a stable state of latch 6 (refer to FIG. 3). Similarly, if the input signal at node IN is a falling edge, when voltage at node OUTB increases to VDDIO, pre-charge transistor N3 will be automatically turned off, and no current flows through pre-charge transistor N3 at the stable state of latch 6. Please note that at the stable state, the voltage at gate 18 is at an inversed phase (with opposite logical voltages) as the voltage at gate 14, and the voltage at gate 16 is at an inversed phase as the voltage at gate 12.

Figure 3:
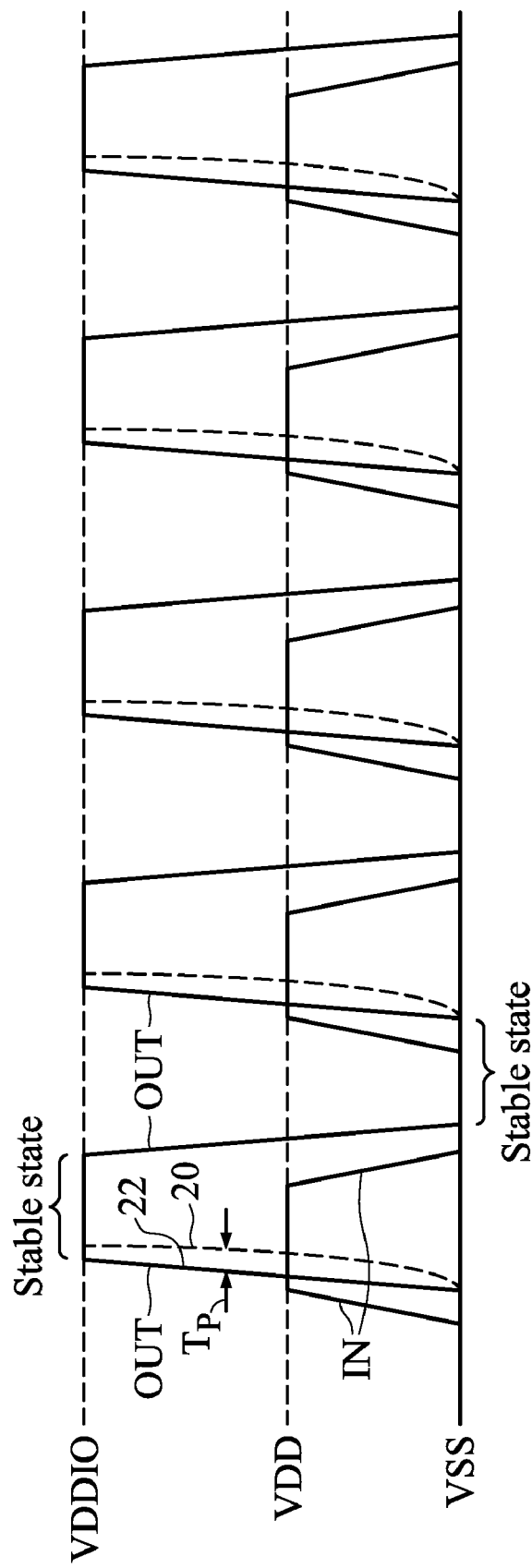
FIG. 3 illustrates a comparison of a schematic waveform of the level shifter shown in FIG. 2 and a schematic waveform of a level shifter not adopting the pre-charging mechanism.

It is realized that even without the pre-charge, when the rising edge of the input signal arrives at gate 12 of transistor N1, latch 6 will eventually pull up the voltage at output node OUT to VDDIO. However, pre-charge transistor N4 is much more efficient than latch 6 in pulling up the voltage at output node OUT. FIG. 3 schematically illustrates the waveforms of input signal IN, which is in the range between VSS and VDD, and output signal OUT, which is in the range between VSS and VDDIO. Dotted line 20 is the rising edge of an output signal obtained from a conventional level shifter not using the pre-charging mechanism (wherein the input signal is directly connected to input node IN3 of inverter INV4, while inverters INV1, INV2, and INV3 are not used). Solid line 22 is the rising edge obtained from a level shifter as shown in FIG. 2. It is noted that line 22 is sharper than line 20, indicating that the circuit as shown in FIG. 2 has a better response to the input signal than the conventional level shifter. As a result, the embodiment of the present invention may be operated at higher frequencies. The time difference between lines 20 and 22 is shown as time Tp. In an embodiment, time Tp may be between about 80 pico-seconds and about 100 pico-seconds.

Time Tp as shown in FIG. 3 may also be used to estimate how many delay-inverters are needed. In a rough estimation, assume rising edge 22 is the rising edge of an ideal square wave, then the required number N of delay-inverters may be expressed as N=Tp/TDinv, wherein TDinv is the delay of each of the delay-inverters such as inverters INV1, INV2, and INV3. The optimum number of delay-inverters, however, is also affected by other factors, such as the ratio of VDDIO to VDD, wherein the greater the ratio, the more delay-inverters that may be needed. The optimum number of the required delay-inverters may be found through experiments and/or simulations. In an embodiment as shown in FIG. 2, there are three delay-inverters. However, one of delay-inverters INV2 and INV3, or both, may be omitted, so that the resulting level shifter only includes one or two delay-inverters. If more than three delay-inverters are needed, the additional delay-inverters may be inserted between inverters INV2 and INV3.

Referring back to FIG. 2, with the increase in the operation frequency, the switching of latch 6 needs to be faster, and NMOS transistors N1 and N2 may need to be larger to provide higher drive currents. This, however, results in the currents flowing through NMOS transistors N1 and N2 being high, resulting in a higher switching noise. FIG. 4 illustrates an embodiment having a reduced switching noise. The embodiment shown in FIG. 4 is similar to the embodiment shown in FIG. 2, wherein like reference numbers are used to indicate like components.

In FIG. 4, in addition to the transistors and inverters as shown in FIG. 2, NMOS transistors N6 and N7 are added, which perform similar functions as NMOS transistors N1 and N2, respectively. The drains of NMOS transistors N6 and N7 are connected to output nodes OUT and OUTB, respectively. The sources of NMOS transistors N6 and N7, instead of being connected to node 4 (VSS), are connected to nodes IN4 and IN3, respectively. Throughout the description, nodes IN3 and IN4 are referred to as non-VSS nodes since they are not directly connected to VSS lines of the level shifter, although the voltages on nodes IN3 and IN4 may sometimes be equal to or close to voltage VSS. Similarly, nodes IN, IN1, IN2, and any other nodes not directly connected to VSS line may also be referred to as non-VSS nodes. In an embodiment, NMOS transistors N1 and N2 as shown in FIG. 4 may be made smaller, for example, with smaller gate widths and/or fewer fingers than NMOS transistors N1 and N2 in FIG. 2. It can thus be considered that NMOS transistor N1 as shown in FIG. 2 is divided into transistors N1 and N6 in FIG. 4, while NMOS transistor N2 as shown in FIG. 2 is divided into transistor N2 and N7 in FIG. 4. It can also be considered that the current originally flowing to the source (VSS) of NMOS transistor N1 in FIG. 2 is now divided into a first portion flowing to VSS node 4 (through NMOS transistor N1 in FIG. 4), and a second portion flowing to node IN4 (through NMOS transistor N6 in FIG. 4). Similarly, the current originally flowing to the source (VSS) of NMOS transistor N2 in FIG. 2 is now divided into a first portion flowing to VSS node 4 (through NMOS transistor N2 in FIG. 4), and a second portion flowing to node IN3 (through NMOS transistor N7 in FIG. 4). The switching noise, which is caused by the variation in the currents flowing through VSS node 4, is thus reduced.

Since the sources of transistors N6 and N7 are connected to nodes IN4 and IN3, respectively, the parasitic capacitance observed at output node OUT is reduced. This further increases the speed of the respective level shifter. The operation speed of the level shifter as shown in FIGS. 2 and 4 may be as high as about 2.5 Gbps when used for dual data rate memories. The improvement, however, does not require additional chip area. As a matter of fact, the chip area usage of the embodiments of the present invention is low. For example, each of pre-charge NMOS transistors N3 and N4 may have only two fingers, each occupying a chip area of 1.5 μm×150 nm. Further, the chip area usage of the embodiment shown in FIG. 4 may even be less than about 35% of the chip area usage of the embodiment shown in FIG. 2. An additional advantageous feature of the present invention is that the same circuits may be used in various specifications, such as for the level shifters with the VDDIO being 2.5V, 1.8V, 1.5V, 1.2V, or the like, without the need to customize the circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a first positive power supply node carrying a first positive power supply voltage;
   a second positive power supply node carrying a second positive power supply voltage higher than the first positive power supply voltage;
   a signal input node;
   a latch comprising:
      a first output node and a second output node complementary to each other;
      a first PMOS transistor and a first NMOS transistor with drains coupled to the first output node; and
      a second PMOS transistor and a second NMOS transistor with drains coupled to the second output node;
   a first pre-charge transistor comprising a source-drain path coupled between the second positive power supply node and the first output node;
   a second pre-charge transistor comprising a source-drain path coupled between the second positive power supply node and the second output node; and
   a first delay-inverter coupled between the signal input node and inputs of the first NMOS transistor and the second NMOS transistor, wherein the first delay-inverter is configured to allow the first pre-charge transistor to pre-charge the first output node before an input signal at the signal input node arrives at a gate of the second NMOS transistor and the second pre-charge transistor to pre-charge the second output node before the input signal at the signal input node arrives at a gate of the first NMOS transistor.

2. The integrated circuit structure of claim 1 further comprising an additional inverter serially coupled with the first delay-inverter, wherein the additional inverter comprises an input and an output coupled to gates of the first NMOS transistor and the second NMOS transistor.

3. The integrated circuit structure of claim 2 further comprising a second delay-inverter serially coupled between the first delay-inverter and the additional inverter.

4. The integrated circuit structure of claim 3 further comprising a third delay-inverter serially coupled between the second delay-inverter and the additional inverter.

5. The integrated circuit structure of claim 1, wherein the first pre-charge transistor and the second pre-charge transistor comprise NMOS transistors.

6. The integrated circuit structure of claim 1, wherein sources of the first NMOS transistor and the second NMOS transistor are connected to a VSS node.

7. The integrated circuit structure of claim 6 further comprising:
   a third NMOS transistor comprising a drain coupled to the first output node, a gate connected to the second output node, and a source connected to a first non-VSS node; and
   a fourth NMOS transistor comprising a drain coupled to the second output node, a gate coupled to the first output node, and a source connected to a second non-VSS node.

8. The integrated circuit structure of claim 7, wherein the first non-VSS node and the second non-VSS node are on a path between an output of the first delay-inverter and a gate of one of the first NMOS transistor and the second NMOS transistor.

9. An integrated circuit structure comprising:
a latch comprising:
a first output node and a second output node complementary to each other;
a first PMOS transistor and a first NMOS transistor with drains coupled to the first output node; and
a second PMOS transistor and a second NMOS transistor with drains coupled to the second output node;
a first pre-charge transistor comprising a source-drain path coupled between a first positive power supply node and the first output node;
a second pre-charge transistor comprising a source-drain path coupled between the first positive power supply node and the second output node; and
a plurality of inverters coupled in series and comprising:
a first inverter, wherein each of a first input and a first output of the first inverter is directly connected to a gate of one of the first pre-charge transistor and the second pre-charge transistor; and
a last inverter, wherein each of a second input and a second output of the last inverter is coupled to a gate of one of the first NMOS transistor and the second NMOS transistor.

10. The integrated circuit structure of claim 9, wherein the plurality of inverters is configured so that when the latch is at a stable state, the gate of the first pre-charge transistor is at an inverted voltage from the gate of the first NMOS transistor.

11. The integrated circuit structure of claim 9, wherein the plurality of inverters comprises three inverters.

12. The integrated circuit structure of claim 11, wherein the plurality of inverters comprises four inverters.

13. The integrated circuit structure of claim 9, wherein sources of the first NMOS transistor and the second NMOS transistor are connected to VSS.

14. The integrated circuit structure of claim 9 further comprising a second positive power supply node coupled to sources of PMOS transistors of the plurality of inverters, wherein the first positive power supply node carries a positive power supply voltage higher than a positive power supply voltage on the second positive power supply node.

15. An integrated circuit structure comprising:
a latch comprising:
a first output node and a second output node complementary to each other;
a first PMOS transistor and a first NMOS transistor with drains coupled to the first output node; and
a second PMOS transistor and a second NMOS transistor with drains coupled to the second output node, wherein sources of the first NMOS transistor and the second NMOS transistor are connected to a VSS node;
a first pre-charge transistor comprising a source-drain path coupled between a first positive power supply node and the first output node;
a second pre-charge transistor comprising a source-drain path coupled between the first positive power supply node and the second output node;
a plurality of inverters coupled in series and comprising:
a first inverter comprising a first input coupled to a gate of the first pre-charge transistor and a first output coupled to a gate of the second pre-charge transistor; and
a last inverter comprising a second input coupled to a gate of the first NMOS transistor and a second output coupled to a gate of the second NMOS transistor;
a third NMOS transistor comprising a drain connected to the first output node, a gate connected to the second output node, and a source connected to a first non-VSS node; and
a fourth NMOS transistor comprising a drain connected to the second output node, a gate connected to the first output node, and a source connected to a second non-VSS node.

16. The integrated circuit structure of claim 15, wherein the source of the third NMOS transistor is connected to the second output of the last inverter.

17. The integrated circuit structure of claim 15, wherein the source of the fourth NMOS transistor is connected to a node between the first output of the first inverter and the second output of the last inverter.

18. The integrated circuit structure of claim 16, wherein the plurality of inverters is configured so that when the latch is at a stable state, the gate of the first pre-charge transistor is at an inverted voltage from the gate of the first NMOS transistor.

19. The integrated circuit structure of claim 15, wherein the plurality of inverters comprises three inverters.

20. The integrated circuit structure of claim 15 further comprising a second positive power supply node coupled to sources of PMOS transistors of the plurality of inverters, wherein the first positive power supply node carries a positive power supply voltage higher than a positive power supply voltage on the second positive power supply node.

* * * * *